(12) United States Patent
Iwasa et al.

(10) Patent No.: US 11,002,427 B2
(45) Date of Patent: May 11, 2021

(54) LIGHT EMITTING DEVICE

(71) Applicant: NICHIA CORPORATION, Anan (JP)

(72) Inventors: Makiko Iwasa, Anan (JP); Yuji Sato, Anan (JP); Hiroki Fukuta, Anan (JP)

(73) Assignee: NICHIA CORPORATION, Anan (JP)

( * ) Notice: Subject to any disclaimer, the term of this patent is extended or adjusted under 35 U.S.C. 154(b) by 3 days.

(21) Appl. No.: 16/831,191

(22) Filed: Mar. 26, 2020

(65) Prior Publication Data
US 2020/0309346 A1    Oct. 1, 2020

(30) Foreign Application Priority Data
Mar. 28, 2019   (JP) .............................. JP2019-062816

(51) Int. Cl.
*F21V 9/30*     (2018.01)
*H01L 33/50*    (2010.01)
*F21Y 115/10*   (2016.01)

(52) U.S. Cl.
CPC .............. *F21V 9/30* (2018.02); *H01L 33/501* (2013.01); *H01L 33/502* (2013.01); *H01L 33/507* (2013.01); *F21Y 2115/10* (2016.08)

(58) Field of Classification Search
CPC . F21V 9/30–38; H01L 2933/0041–005; H01L 2933/0091; H01L 33/50–56; F21K 9/64
See application file for complete search history.

(56) References Cited

U.S. PATENT DOCUMENTS

| | | | |
|---|---|---|---|
| 2010/0320479 A1 | 12/2010 | Minato et al. | |
| 2012/0025218 A1* | 2/2012 | Ito | H01L 33/505 257/88 |
| 2015/0021642 A1 | 1/2015 | Nakabayashi | |
| 2015/0054011 A1* | 2/2015 | Koizumi | H01L 33/505 257/98 |
| 2015/0129914 A1* | 5/2015 | Tien | H01L 33/486 257/98 |
| 2015/0287896 A1 | 10/2015 | Minato et al. | |
| 2015/0340569 A1 | 11/2015 | Tamaki et al. | |

(Continued)

FOREIGN PATENT DOCUMENTS

| | | |
|---|---|---|
| JP | 2010-219324 A | 9/2010 |
| JP | 2010-283281 A | 12/2010 |

(Continued)

*Primary Examiner* — Mariceli Santiago
(74) *Attorney, Agent, or Firm* — Foley & Lardner LLP (57) ABSTRACT

A light emitting device has a covering member. The covering member includes light reflecting material and a second fluorescent material, and a dominant wavelength of an emission spectrum of the second fluorescent material differs from a dominant wavelength of an emission spectrum of the light emitting device by 30 nm or less. The light emitting device emits light with chromaticity that is within a four-sided region on a CIE 1931 chromaticity diagram, where chromaticity coordinates (x, y) are (0.645, 0.335) at a first point, (0.665, 0.335) at a second point, (0.735, 0.265) at a third point, (0.721, 0.259) at a fourth point, and a first line joins the first and second points, a second line joins the second and third points, a third line joins the third and fourth points, and a fourth line joins the fourth and first points to define the four-sided region of the chromaticity diagram.

10 Claims, 7 Drawing Sheets

(56) References Cited

U.S. PATENT DOCUMENTS

| | | |
|---|---|---|
| 2016/0190395 A1 | 6/2016 | Shirahama |
| 2016/0240746 A1* | 8/2016 | Yun .................. H01L 33/54 |
| 2017/0040498 A1 | 2/2017 | Tamaki et al. |
| 2017/0154880 A1 | 6/2017 | Ozeki et al. |
| 2017/0236981 A1 | 8/2017 | Nakabayashi |
| 2018/0069164 A1 | 3/2018 | Minato et al. |
| 2018/0182929 A1 | 6/2018 | Ozeki et al. |
| 2019/0081222 A1 | 3/2019 | Nakabayashi |
| 2019/0097086 A1 | 3/2019 | Shichijo et al. |
| 2019/0172976 A1 | 6/2019 | Ozeki et al. |
| 2019/0326497 A1* | 10/2019 | Hayashi ............. H01L 33/58 |
| 2019/0385993 A1 | 12/2019 | Ozeki et al. |
| 2020/0051959 A1* | 2/2020 | Pschenitzka ....... H01L 33/505 |

FOREIGN PATENT DOCUMENTS

| | | | |
|---|---|---|---|
| JP | 2011-134829 A | 7/2011 | |
| JP | 2012-134355 A | 7/2012 | |
| JP | 2013-168685 A | 8/2013 | |
| JP | 2013-219397 A | 10/2013 | |
| JP | 2014-096605 A | 5/2014 | |
| JP | 2015-023162 A | 2/2015 | |
| JP | 2015-038963 A | 2/2015 | |
| JP | 2015-173287 A | 10/2015 | |
| JP | 2015-201657 A | 11/2015 | |
| JP | 2015-220394 A | 12/2015 | |
| JP | 2015-220431 A | 12/2015 | |
| JP | 2016-092110 A | 5/2016 | |
| JP | 2016-127111 A | 7/2016 | |
| JP | 2016-189488 A | 11/2016 | |
| JP | 2017-108092 A | 6/2017 | |
| JP | 2018-107371 A | 7/2018 | |
| JP | 2019-062172 A | 4/2019 | |
| WO | WO-2007018039 A1 * | 2/2007 | ........... H01L 33/501 |
| WO | WO-2008043519 A1 * | 4/2008 | ........... H01L 33/508 |
| WO | WO-2009/069671 A1 | 6/2009 | |

\* cited by examiner

FIG. 6A
COMPARISON EXAMPLE 1

FIG. 6B
COMPARISON EXAMPLE 1

FIG. 7A
COMPARISON EXAMPLE 2

FIG. 7B
COMPARISON EXAMPLE 2

FIG. 8A
FIRST EMBODIMENT

FIG. 8B
FIRST EMBODIMENT

FIG. 9A
SECOND EMBODIMENT

FIG. 9B
SECOND EMBODIMENT

FIG. 10A
COMPARISON EXAMPLE 3

FIG. 10B
COMPARISON EXAMPLE 3

FIG. 11A
COMPARISON EXAMPLE 4

FIG. 11B
COMPARISON EXAMPLE 4

FIG. 12A
THIRD EMBODIMENT

FIG. 12B
THIRD EMBODIMENT

FIG. 13A
FOURTH EMBODIMENT

FIG. 13B
FOURTH EMBODIMENT

LIGHT EMITTING DEVICE

CROSS-REFERENCE TO RELATED APPLICATION

The present application claims priority under 35 U.S.C. § 119 to Japanese Patent Application No. 2019-062816, filed on Mar. 28, 2019, the contents of which are incorporated herein by reference in their entirety.

BACKGROUND

1. Field of the Invention

The present disclosure relates to a light emitting device.

2. Description of the Related Art

In recent years, development of the chip-scale package (CSP), which has essentially the same surface area as a light emitting element (chip), has evolved. Chip-scale packaging allows the number of light emitting devices and their circuit board mounting locations to be easily modified depending on requirements. This increases flexibility in the design of equipment such as lighting.

For example, Japanese Patent Publication No. 2012-134355 describes a light emitting device that has a light emitting element; a fluorescent material (phosphor) layer disposed on top of the light emitting element that changes the wavelength of light emitted by the light emitting element; a translucent member on which the fluorescent material layer is formed and that is disposed above the fluorescent material layer; and reflecting material disposed adjacent to the lateral surfaces of the light emitting element, the fluorescent material layer, and the translucent member. In this light emitting device, the reflecting material reflects light from the light emitting element and fluorescent material layer to attain high front-view luminance (brightness).

Because the surface area of the package for this light emitting device is essentially the same as the light emitting element, a covering member that covers the lateral surfaces of the light emitting element is accordingly thin. As a result, light from the light emitting element can leak through the covering member and can cause observation direction-dependent color non-uniformity (uneven color), which is chromaticity variation that depends on the direction from which the light emitting device is observed. For example, in a light emitting device that emits red light using a light emitting element that emits blue light, large color differences can result from light emitting element light leaking through the covering member and this can cause chromaticity to vary perceptibly with the direction of light emission.

One object of certain embodiments of the present invention is to provide a light emitting device with improved color uniformity.

SUMMARY

According to one embodiment, a light emitting device includes a light emitting element having a dominant wavelength in a range greater than or equal to 380 nm and less than or equal to 470 nm, a wavelength conversion member that is disposed on top of the light emitting element and includes a first fluorescent material, and a covering member that covers the sides of the wavelength conversion member and surrounds the light emitting element. The light emitting device emits light with a spectrum having a dominant wavelength in a range greater than or equal to 610 nm and less than or equal to 780 nm. The covering member includes light reflecting material and a second fluorescent material, and the spectrum of the second fluorescent material has a dominant wavelength that differs from that of the light emitting device by less than or equal to 30 nm. Chromaticity of light emitted by the light emitting device is within a four-sided region on a CIE (Commission internationale de l'éclairage) 1931 chromaticity diagram, where chromaticity coordinates (x, y) are (0.645, 0.335) at a first point, (0.665, 0.335) at a second point, (0.735, 0.265) at a third point, (0.721, 0.259) at a fourth point, and a first line joins the first and second points, a second line joins the second and third points, a third line joins the third and fourth points, and a fourth line joins the fourth and first points to define the four-sided region of the chromaticity diagram.

According to another embodiment, a light emitting device includes a light emitting element having a dominant wavelength in a range greater than or equal to 380 nm and less than or equal to 470 nm, a wavelength conversion member that is disposed on top of the light emitting element and includes a first fluorescent material, and a covering member that covers the sides of the wavelength conversion member and surrounds the light emitting element. The light emitting device emits light with a spectrum having a dominant wavelength in a range greater than or equal to 610 nm and less than or equal to 780 nm. The covering member includes light reflecting material and a second fluorescent material, and the spectrum of the second fluorescent material has a dominant wavelength that differs from that of the light emitting device by less than or equal to 30 nm. The second fluorescent material included in the covering member is at least one compound selected from (Ca, Sr)AlSiN$_3$:Eu and (Ca, Sr, Ba)$_2$Si$_5$N$_8$:Eu, and the first fluorescent material included in the wavelength conversion member is at least one compound selected from (Ca, Sr)AlSiN$_3$:Eu and (Ca, Sr, Ba)$_2$Si$_5$N$_8$:Eu.

According to certain embodiments of the present disclosure, a light emitting device having improved color uniformity can be provided.

BRIEF DESCRIPTION OF THE DRAWINGS

More complete appreciation of the invention and many of its attendant advantages can be readily obtained as the invention becomes better understood by reference to the subsequent detailed description considered in conjunction with the following accompanying drawings.

DETAILED DESCRIPTION

Embodiments and examples of the present invention are described below with reference to the accompanying drawings. Common reference numerals designate corresponding or identical elements throughout the various drawings. However, the embodiments and examples described below are merely examples intended to concretely illustrate technical concepts of the present invention, and the present invention is not limited to the descriptions below. Properties such as the size and spatial relation of components shown in the figures may be exaggerated for the purpose of clear explanation. Detailed description of parts having the same name and reference numeral (corresponding or identical elements) is appropriately abbreviated. Further, in the embodiments and examples of the present invention, a single component can serve multiple functions and a plurality of structural elements of the invention can be implemented with the same component. In contrast, the functions of a single component can be separated (distributed) and implemented by a plurality of components. Explanations used to describe one embodiment or example may be used in the description of other embodiments and examples. In the following descriptions, terms indicating directional and positional relations (such as "upper," "lower," "right," "left," and expressions that include those positional relation terms) are used as required. However, use of those terms is merely intended to indicate relative directions and positions, to make the invention easily understood when referring to the drawings. The technical scope of the invention is not limited by the meaning of those terms unless explicitly stated. In the present application, the term "is provided" is used with a meaning that includes provision of separate elements, as well as provision of elements configured as a single unit.

In this application, the relation between color name and chromaticity diagram coordinates, and the relation between the color name of monochromatic light and its range of wavelengths is in accordance with Japanese Industrial Standard (JIS) Z8110. In addition, when a plurality of substances are present in each component of a compound, unless otherwise noted, the content (amount) of each component is taken to mean the total amount of the plurality of substances included in the compound.

First Embodiment

Figure 1A:
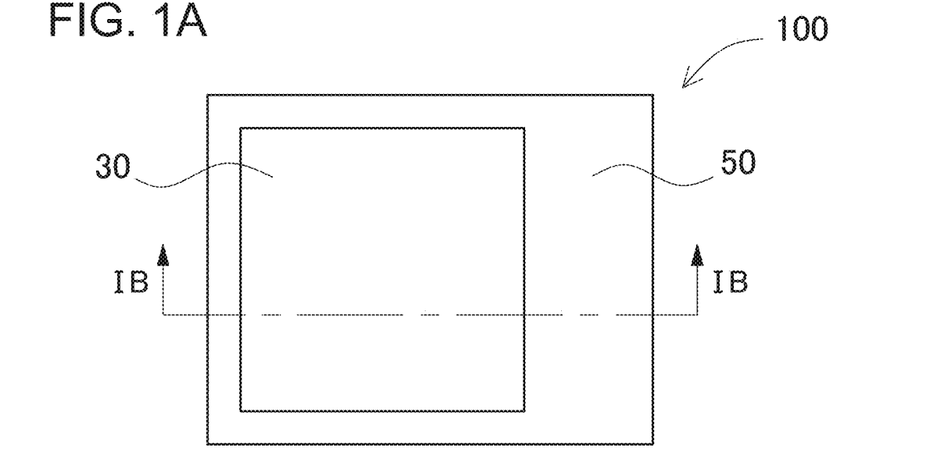
FIG. 1A is a schematic plan view showing one example of a light emitting device for the first embodiment of the present invention.
Figure 1B:
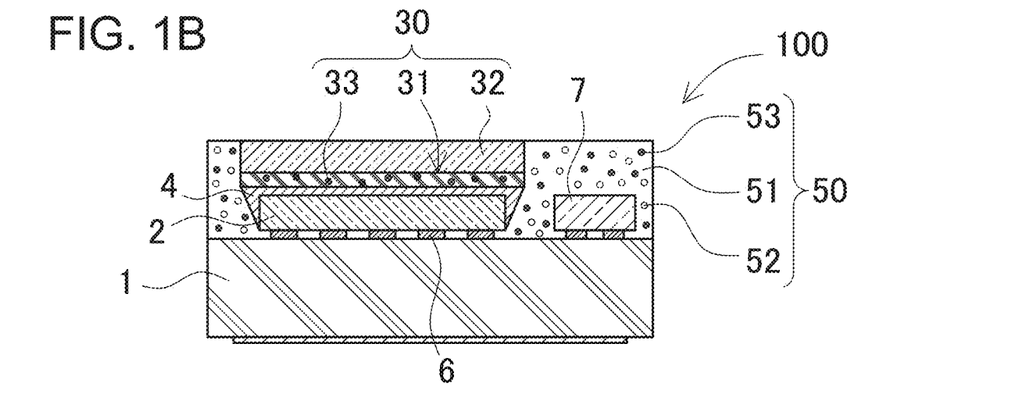
FIG. 1B is a cross-section through the line IB-IB in FIG. 1A.
Figure 1C:
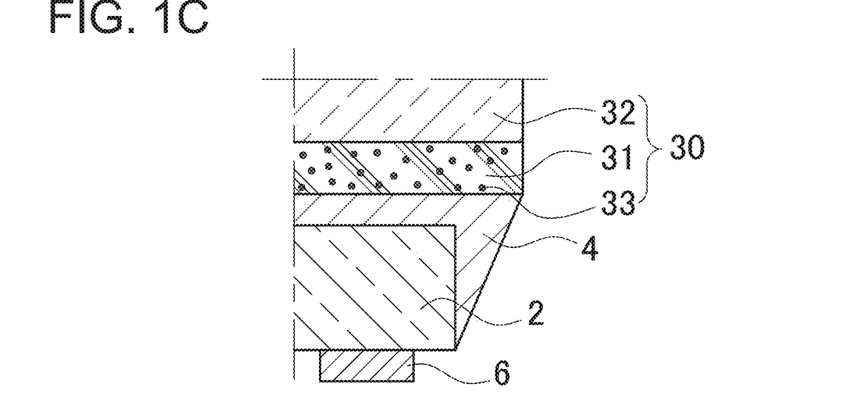
FIG. 1C is an enlarged cross-section view of one part of FIG. 1B.

A light emitting device according to a first embodiment of the present invention is shown in FIGS. 1A-1C. FIG. 1A is a plan view of the light emitting device 100 according to the first embodiment, FIG. 1B is a vertical cross-section through the line IB-IB in FIG. 1A, and FIG. 1C is an enlarged cross-section view of an end region of the adhesive layer 4 shown in FIG. 1B. The light emitting device 100 shown in these figures is provided with a mounting substrate 1, a light emitting element 2, a wavelength conversion member 30, and a covering member 50. The mounting substrate 1 has a substrate primary surface that faces in the same direction as the light emitting surface of the light emitting device 100. The light emitting element 2 is mounted in "flip chip" fashion via conducting material 6 on the primary surface of the mounting substrate 1. The wavelength conversion member 30 is joined to the upper surface (primary surface) of the light emitting element 2 via the adhesive layer 4.

A Covering Member 50

The covering member 50 covers the lateral surfaces of the wavelength conversion member 30 and the light emitting element 2, which is joined with the wavelength conversion member 30. The covering member 50 contains resin 51. For example, resins such as phenol resin, epoxy resin, bismaleimide triazine resin, polyphthalamide resin, and silicone resin can be used as the resin 51 in the covering member 50. The covering member 50 also contains light reflecting material 52 and second fluorescent material 53 within the resin 51. Materials such as titanium (di)oxide, alumina, and silicon (di)oxide can be used as light reflecting material 52. Although the second fluorescent material 53 is also described later, the dominant wavelength of the spectrum of the second fluorescent material 53 differs from the dominant wavelength of the spectrum of the light emitting device by 30 nm or less. Further, little change with angular direction (of the incident light) is a desirable characteristic for the second fluorescent material 53. Material that absorbs light emitted by the light emitting element such as pigments can also be included in the covering member 50.

A Wavelength Conversion Member 30

The upper surface of the wavelength conversion member 30 serves as the light emitting surface and is exposed from the covering member 50. The wavelength conversion member 30 is made up of a fluorescent material layer 31 that includes first fluorescent material 33, and a translucent member 32 configured as a single unit on top of the fluorescent material layer 31.

The light emitting device 100 can also be provided with a semiconductor element 7. The semiconductor element 7 is a protection device such as a Zener diode that protects the light emitting element 2 when reverse voltage is applied (e.g. plugged-in-backwards). Depending on requirements, the semiconductor element 7 can be omitted. The following describes each component of the light emitting device 100 in detail.

Mounting Substrate 1

It is desirable for the mounting substrate 1 to have insulating properties. In addition, the mounting substrate 1 is preferably material that does not easily pass light from the light emitting element 2 or external light (i.e. opaque material). For example, ceramics such as alumina and aluminum nitride, or resins such as phenol resin, epoxy resin, polyimide resin, bismaleimide triazine resin, and polyphthalamide resin can be used as mounting substrate material. When resin material is used, inorganic filler such as glass fiber, silicon oxide, titanium oxide, and or alumina can be mixed into the resin as necessary. This can facilitate improved mechanical strength (robustness), lower thermal expansion coefficient, and higher light reflectivity.

Light Emitting Element 2

The light emitting element 2 is preferably a light emitting diode, and a light emitting diode with a wavelength appropriate for the application can be selected. For example, nitride semiconductors ($In_xAl_yGa_{1-x-y}N$, $0 \leq x$, $0 \leq y$, $x+y \leq 1$) that can emit short wavelength light for efficient excitation of the first fluorescent material 33 can be proposed as the light emitting element 2. A variety of wavelengths can be selected depending on semiconductor layer material and crystallinity mix. The light emitting element 2 emits light with a dominant wavelength within a range between 380 nm and 470 nm.

A Wavelength Conversion Member 30

The wavelength conversion member 30 is configured as a fluorescent material layer 31 of resin containing first fluorescent material 33, and a translucent member 32 such as glass. However, the wavelength conversion member is not limited to this configuration. For example, the wavelength conversion member 30 may be configured as a fluorescent material ceramic that is a sintered mixture of fluorescent and ceramic materials, a fluorescent material sheet that is resin with fluorescent material mixed in and formed in a sheet, and glass that includes fluorescent material.

Fluorescent Material Layer 31

The fluorescent material layer 31 absorbs at least part of the light emitted by the light emitting element 2 and re-emits light at a different wavelength. Translucent material such as resin, glass, or other inorganic materials with first fluorescent material 33 mixed as a binder can be used to form the fluorescent material layer 31. The fluorescent material layer 31 can be formed as a single layer containing one type of fluorescent material, as a single layer containing a mixture of two or more types of fluorescent material, or as a laminate of two or more single layers. In addition, coloring agent, light diffusing agent, and filler can also be added as required.

In the example shown in FIG. 1B, the wavelength conversion member 30 is formed with a surface area larger than the surface area of the light emitting element 2 upper surface (primary surface). This arrangement introduces light emitted by the light emitting element 2 into the wavelength conversion member 30 over a wide area and can reduce color non-uniformity. However, the present invention is not limited to this configuration and the surface area of the wavelength conversion member 30 can also be smaller than that of the primary surface of the light emitting element 2. In that case, the front-side brightness of the light emitting device can be increased.

The fluorescent material layer 31 is formed on a surface of the translucent member 32 (further described below) by a method such as printing. In the present embodiment, fluorescent material layer 31 disposition not only includes direct contact with a surface of the translucent member 32, but also includes connection with the translucent member 32 via other materials such as adhesive. For example, compression bonding, thermally fused connection, sintering, adhesion by organic adhesive, and adhesion by inorganic adhesive (e.g. low melting point glass) are possible connection methods. Methods used to form the fluorescent material layer include printing methods, compression molding, fluorescent material electro-deposition, and fluorescent material sheet formation. In a printing method, a paste is prepared that includes fluorescent material, binder, and solvent, and that paste is applied to a surface of the translucent member 32 and dried to form the fluorescent material layer. Organic resin binders such as epoxy resin, silicone resin, phenol resin, and polyimide resin, or inorganic binders such as glass can be used as the paste binder. In compression molding, fluorescent material layer raw material, which is binder containing fluorescent material, is placed on the surface of the translucent member 32 in a mold, and compression molded. In fluorescent material electro-deposition, a thin conducting film that can pass light is formed on the surface of the translucent member 32, and fluorescent material charged using electrophoresis is deposited on the thin film. Finally, in fluorescent material sheet formation, fluorescent material is mixed and kneaded into silicone resin, and processed into sheet form. Because this method employs fluorescent material in sheet form, the thickness of that sheet can be made as thin as possible from a heat dissipation standpoint. Here, fluorescent material sheet with a thickness on the order of 100 μm or less is compression bonded to the translucent member 32 to make a consolidated structure.

A thickness of the fluorescent material layer 31 is greater than or equal to 20 μm and less than or equal to 200 μm, and preferably greater than or equal to 30 μm and less than or equal to 150 μm. This is because a thickness greater than 200 μm shows a tendency for reduced heat dissipation. While a fluorescent material layer made as thin as possible is desirable from a heat dissipation standpoint, if it is made too thin, the amount of first fluorescent material 33 becomes sparse and this has the tendency to reduce the range of color (chromaticity range) emitted. With these considerations, the fluorescent material layer 31 thickness is established as appropriate.

The light emitting device 100 emits red light (JIS red), which according to JIS Z8110, is light with a dominant wavelength from nm to 780 nm. The light emitting device 100 emits light in a range that is within a four-sided region on the CIE1931 chromaticity diagram shown in FIG. 2. The four-sided region of the chromaticity diagram is defined by four points and four lines connecting those points, where chromaticity coordinates (x, y) are (0.645, 0.335) at a first point, (0.665, 0.335) at a second point, (0.735, 0.265) at a third point, (0.721, 0.259) at a fourth point, and a first line joins the first and second points, a second line joins the second and third points, a third line joins the third and fourth points, and a fourth line joins the fourth and first points.

First Fluorescent Material 33

By using a blue light emitting element 2 together with first fluorescent material 33, which emits red light when excited by blue light from the light emitting element, the light emitting device 100 can emit red light. Examples of first fluorescent material 33 that can be advantageously combined with the light emitting element 2 to emit red light include fluorescent material given by the chemical formulas $(Sr, Ca)AlSiN_3:Eu$ and $(Ca, Sr, Ba)_2Si_5N_8:Eu$. Other fluorescent material that emit red light include, for example, $(Ca, Sr, Ba)S:Eu$, $K_2(Si, Ti, Ge)F_6:Mn$, $3.5MgO \cdot 0.5MgF_2 \cdot GeO_2:Mn$, and $(Sr, Ca)LiAl_3N_4:Eu$. Here, except for special cases, when a plurality of elements in the fluorescent material formula are separated by a comma (,), at least one of those elements is included in the chemical composition and two or more of those elements can also be included in combination. Also in the present application, a colon (:) in the fluorescent material formula separates elements of the crystal matrix and their molar ratio, which are positioned before the colon, from activating elements noted after the colon. Molar ratio indicates the number of moles (proportions) of elements in the composition of 1 mole of fluorescent material.

To realize a light emitting device 100 that can emit red light, the concentration of first fluorescent material 31 in the fluorescent material layer 31 is adjusted to make the emitted light red. For example, first fluorescent material 33 concentration is made greater than or equal to 100 mass % and less than or equal to 200 mass % with respect to resin, etc.

If first fluorescent material is sufficiently included to keep the chromaticity of light emitted by the light emitting device within the specified range, a third fluorescent material that emits light from yellow-green to orange can be additionally mixed with the first fluorescent material.

Third fluorescent material includes, for example, $(Lu, Y, Gd, Tb)_3(Al, Ga)_5O_{12}:Ce$, which is the chemical composition of yttrium-aluminum-garnet system fluorescent material and is subsequently abbreviated as (YAG) in this application.

Other fluorescent material that can be added include, for example, $Si_{6-z}Al_zO_zN_{8-z}:Eu$ (0<z<4.2), $Ca_3Sc_2Si_3O_{12}:Ce$, $CaSc_2O_4:Ce$, $(La, Y, Gd)_3(Al, Si)_6N_{11}:Ce$, $(Ca, Sr, Ba)_8MgSi_4O_{16}(F, Cl, Br)_2:Eu$, $(Ca, Sr, Ba)_3Si_6O_9N_4:Eu$, $(Ca, Sr, Ba)_3Si_6O_{12}N_2:Eu$, $(Ba, Sr, Ca)Si_2O_2N_2:Eu$, $(Ba, Sr, Ca, Mg)_2SiO_4:Eu$, $(Ba, Sr, Ca)Ga_2S_4:Eu$, $(Ca, Sr, Ba, Mg)_{10}(PO_4)_6(F, Cl, Br, I, OH)_2:Eu$, $(Ba, Sr, Ca)_3MgSi_2O_8:Eu$, $Sr_4Al_{14}O_{25}:Eu$, $(Si, Al)_6(O, N)_8:Eu$.

Translucent Member 32

A translucent member 32 is prepared separately from the fluorescent material layer 31, which contains first fluorescent material 33. The translucent member 32 is the part that supports the fluorescent material layer 31 formed on its surface. Translucent plate material such as glass or resin can be used as the translucent member 32. Glass can be selected from materials such as borosilicate glass or quartz glass, and resin can be selected from materials such as silicone resin or epoxy resin.

A thickness of the translucent member 32 should be sufficient to avoid loss of mechanical strength during processing and furnish ample mechanical strength to the fluorescent material layer 31. If the translucent member 32 is too thick, it can obstruct miniaturization of the light emitting device or degrade heat dissipation. Accordingly, a suitable thickness is desired. The translucent member 32 can also include light diffusing agent. As the concentration of fluorescent material in the fluorescent material layer 31 is increased, emitted light becomes more prone to color non-uniformity, and the presence of light diffusing agent can alleviate color non-uniformity as well as brightness non-uniformity. For example, titanium oxide, barium titanate, aluminum oxide, and silicon oxide can be used as light diffusing agent.

The upper surface of the translucent member 32, which becomes the light emitting surface, is not limited to a smooth planar surface, and can have minute bumps, indentations or general roughness. This can promote scattering of light output from the light emitting surface and can further suppress color and brightness non-uniformity. In addition, the light emitting surface can be treated with an antireflection (AR) coating or a distributed Bragg reflector (DBR) film.

Adhesive Layer 4

An adhesive layer 4 intervenes between the light emitting element 2 and the fluorescent material layer 31. The adhesive layer 4 bonds the fluorescent material layer 31 to the light emitting element 2. Adhesive that makes up the adhesive layer 4 is material that can effectively guide light output from the light emitting element 2 into the fluorescent material layer 31, and preferably is material that can optically couple the fluorescent material layer 31 with the light emitting element 2. Specifically, epoxy resin, silicone resin, phenol resin, and polyimide resin are candidate materials. Of those resins, silicone resin, which is extremely durable, is favored as adhesive for the adhesive layer 4. The adhesive layer 4 is made as thin as possible. This is because, for example, a thin layer improves heat dissipation properties and reduces light loss due to transit through the adhesive layer thereby improving the light output of the light emitting device.

In the case in which silicone resin is used as binder in the fluorescent material layer 31, it is desirable to also use silicone resin as adhesive in the adhesive layer 4. This can reduce refractive index differences between the fluorescent material layer 31 and the adhesive layer 4 and can increase the input of light from the adhesive layer 4 into the fluorescent material layer 31.

Semiconductor Element 7

The semiconductor element 7 is separate from the light emitting element 2 and is disposed adjacent to the light emitting element 2 on the mounting substrate. The semiconductor element 7 can be a semiconductor chip that is similar to a light emitting element except that is not designed for light emission, a transistor to control the light emitting element, or a protection device as described below. A protection device protects the light emitting element 2 from damage or functional degradation due to over-voltage application. Specifically, a Zener diode, which conducts when a voltage greater than the specified voltage is applied to the light emitting device, serves as the protection device. The protection device is a semiconductor chip that has a p-type electrode and an n-type electrode the same as the light emitting element 2. However, the protection device is connected in parallel with the light emitting element 2 in opposite polarity. Namely, the p-electrode of the protection device is electrically connected to the n-electrode of the light emitting element 2 and the n-electrode of the protection device is electrically connected to the p-electrode of the light emitting element 2 via conducting material 6. In the same manner as the light emitting element 2, each electrode terminal of the protection device is aligned on top of a corresponding conducting material bump and joined via heat, ultra-sonic, and/or compression application.

A Covering Member 50

Insulating material is desirable for use as a covering member 50 material. To provide some degree of robustness, materials such as thermosetting resin or thermoplastic resin are used. More specifically, phenol resin, epoxy resin, bismaleimide triazine resin, polyphthalamide resin, and silicone resin are candidate materials. Coloring agent and/or filler can also be added depending on requirements.

A covering member 50 application can be performed, for example, by a dispensing tool that can be moved vertically and horizontally with respect to the mounting substrate 1 held stationary beneath the dispenser. Namely, resin that includes the previously described light reflecting material 52 and second fluorescent material 53 is prepared and loaded into the dispensing tool. Subsequently, by dispensing resin while moving the tip of dispenser nozzle around the light emitting element, a covering member 50 is applied around the light emitting element 2 and the semiconductor element 7. The speed at which the dispensing tool moves is appropriately adjusted depending on factors such as the viscosity and temperature of the resin being used. The quantity of resin dispensed can be adjusted by maintaining conditions such as constant pressure during dispensing.

The thinnest region of the covering member, which is coating on a lateral surface (not adjacent to the semiconductor element 7) of the light emitting element, preferably has a minimum thickness greater than or equal to 100 μm and a maximum thickness less than or equal to 300 μm measured perpendicular to the lateral surface of the light emitting element. If the covering member is too thin, light from the light emitting element can leak through the covering member and cause color non-uniformity. If the covering member is made thick, it is difficult for light to escape but the size of the light emitting device becomes excessively large.

Light Reflecting Material 52

By distributing particulate light reflecting material 52, which does not easily absorb light from the light emitting element 2 and has a refractive index significantly different from that of the resin base, within the resin base of the covering member 50, light can be efficiently reflected. Light reflecting material 52 preferably includes at least one of the oxides of, for example, yttrium, zirconium, aluminum, titanium, and/or silicon. The amount of light reflecting material 52 included in the resin is preferably greater than or equal to 10 mass % and less than or equal to 100 mass % (with respect to the resin).

Second Fluorescent Material 53

By adding second fluorescent material to the covering member 50, light that passes through the light reflecting material without being reflected can be wavelength-converted by the second fluorescent material making it possible to further reduce light emitting device 100 color non-uniformity. In the case of a light emitting device 100 that emits red light, essentially all the light emitted by the light emitting element is wavelength-converted by fluorescent material, and effectively no unconverted light emitting element (non-red) light is output from the wavelength conversion member. The difference between the chromaticity of light emitting element light that passes through the light reflecting material and the chromaticity of light observed exiting the wavelength conversion member is reduced (due to wavelength-conversion by the second fluorescent material). Accordingly, this reduces color non-uniformity as a function of the direction from which the light emitting device 100 is observed.

It is desirable to use second fluorescent material 53 included in the covering member 50 that is of the same type as the first fluorescent material 33, which is included in the fluorescent material layer 31 of the wavelength conversion member 30. For example, fluorescent material indicated by the formula (Sr, Ca)AlSiN$_3$:Eu (in this application, subsequently abbreviated by SCASN) and (Ca, Sr, Ba)$_2$Si$_5$N$_8$:Eu can be used.

The second fluorescent material 53 can be material with the same chemical formula as the first fluorescent material 33 included in the fluorescent material layer 31 or material with a different chemical formula. Second fluorescent material 53 added to the covering member 50 has a spectrum with a dominant wavelength that differs from the dominant wavelength of the spectrum of the light emitting device by less than or equal to 30 nm, preferably less than or equal to 20 nm, and more preferably less than or equal to 10 nm. The average particle diameter of the fluorescent material is preferably greater than or equal to 2 μm and less than or equal to 10 μm. The amount of fluorescent material added is preferably greater than or equal to 0.5 mass % and less than or equal to 10 mass % with respect to the resin.

Conducting Material 6

Bumps can be used as conducting material 6, and gold (Au) or gold-alloy can be used as bump material. Other possible conducting materials include eutectic solder (Au—Sn), Pb—Sn, and lead-free solder. Although FIG. 1B shows an example where bumps are used as the conducting material 6, the conducting material 6 is not limited to bumps and, for example, conducting paste can be used as well.

Second Embodiment

Figure 3:
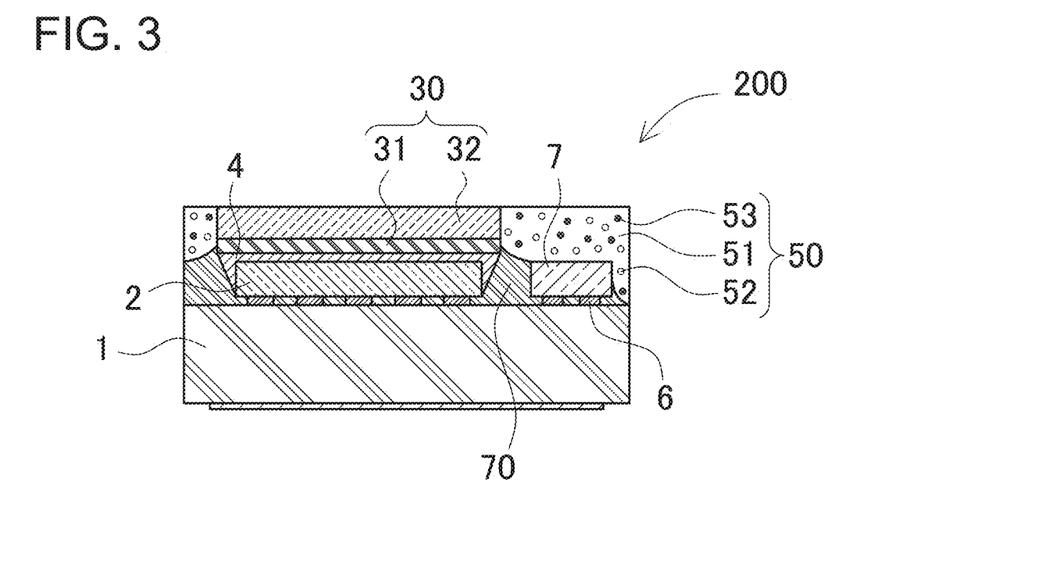
FIG. 3 is a cross-section of a light emitting device for the second embodiment of the present invention.

Underfill can be used together with the covering member 50. An example of this configuration is in the light emitting device 200 of the second embodiment shown in the schematic cross-section of FIG. 3. In the light emitting device 200 shown in this figure, the same (numeric) reference labels are used to indicate components that are the same as in the previously described first embodiment and their detailed description is abbreviated.

Underfill 70

Underfill 70 is material intended to protect the light emitting element, semiconductor element, and conducting material disposed on the mounting substrate from contaminants and detrimental conditions such as dust, moisture, and externally applied force. Depending on requirements, underfill 70 can be established within gaps beneath and between the light emitting element 2, semiconductor element 7, and conducting material 6.

Underfill 70 material can be, for example, silicone resin or epoxy resin. Additives such as coloring agent, light diffusing agent, filler, and fluorescent material can also be included in the resin material. By disposing underfill 70 between the light emitting element 2 and the covering member 50, light escaping from the bottom side of the light emitting element 2 is reflected back towards the light emitting element 2 and a wavelength conversion member 30, and this can increase light extraction efficiency from the upper surface of the light emitting device. Further, because inclusion of additives such as coloring agent, light diffusing agent, filler, and fluorescent material in the underfill increases the effect of suppressing light that would otherwise pass through the covering member 50 (before reaching the covering member 50), light emitting device chromaticity variation with observation direction can be constrained.

EXAMPLES

While examples of the present invention are described in detail below, the present invention is not limited to these examples.

Figure 2:
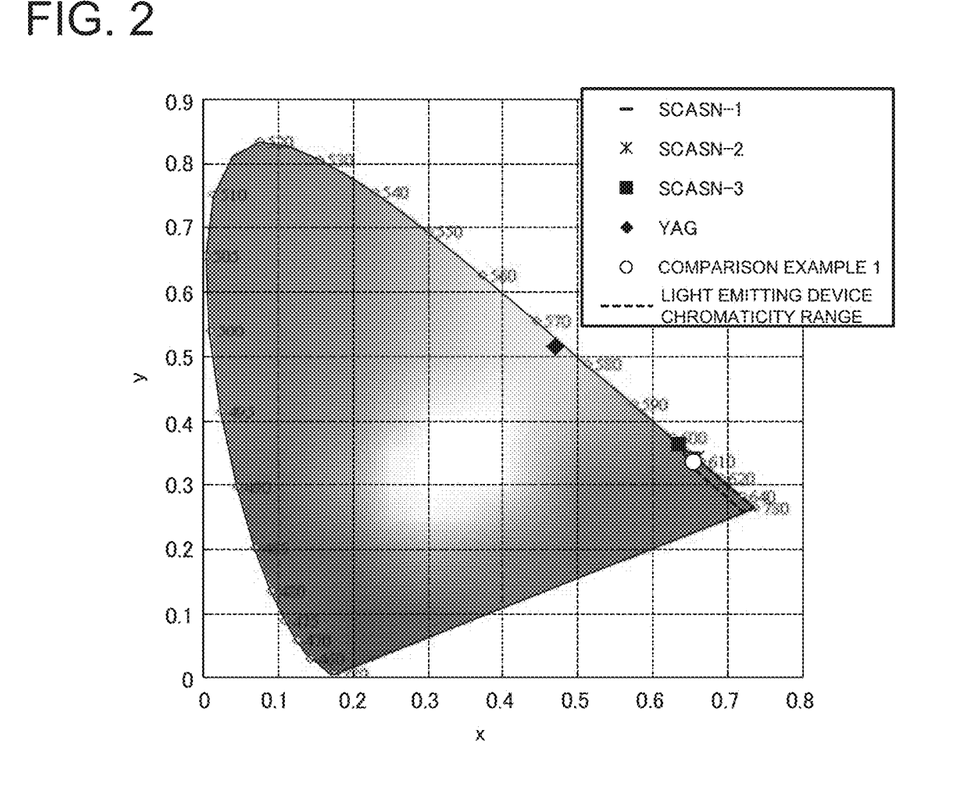
FIG. 2 is a chromaticity diagram showing light emitting device chromaticity for the fluorescent materials of FIG. 1B and comparative example 1.
Figure 4:
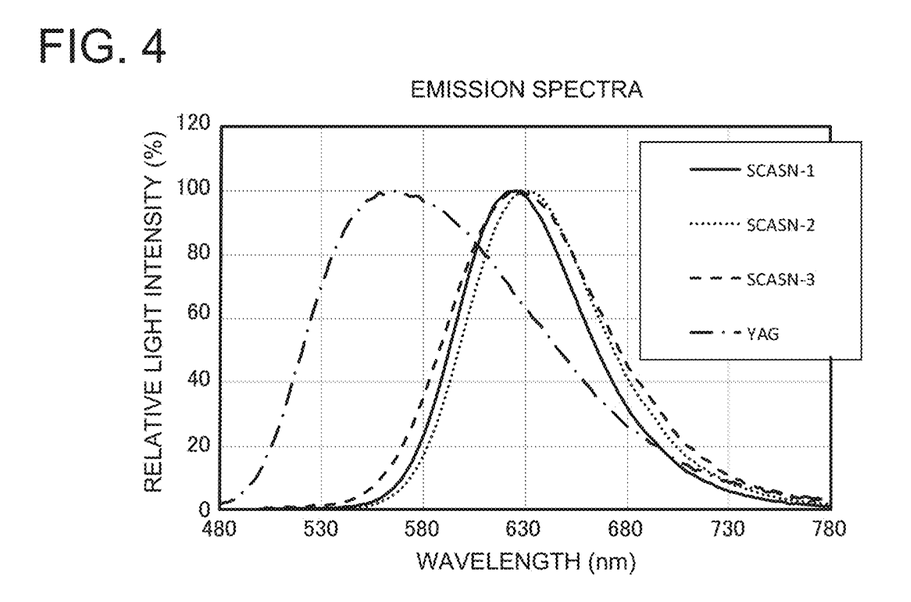
FIG. 4 is a graph showing light emission spectra for the fluorescent materials of FIG. 1B.

Fluorescent materials used in the examples and comparative examples are shown in Table 1. Fluorescent materials in Table 1 are SCASN [(Sr, Ca)AlSiN$_3$:Eu] material: SCASN-1, SCASN-2, and SCASN-3, which have different spectral dominant wavelengths and chromaticity; and YAG [Y$_3$Al$_5$O$_{12}$:Ce] material, which has a different chemical formula as well as different spectral dominant wavelength and chromaticity. The emission spectrum of each fluorescent material is shown in FIG. 4. For the average particle diameter of each fluorescent material, a Fisher Sub-Sieve Sizer was used to measure Fisher Number according to the "air permeability principle." Specifically, a 1 cm$^3$ sample was measured and packed in the cylindrical test chamber; dry air flow was supplied with constant pressure to the test chamber; specific surface area was determined from the pressure differential across the test chamber, and that value was converted to average particle diameter. Fluorescent material chromaticity (coordinates) on a chromaticity diagram are as shown in FIG. 2. In Table 1, fluorescent material "peak wavelength" is the wavelength at the maximum (peak) relative emission intensity of the fluorescent material emission spectrum (e.g. as shown in FIG. 4). Further, "dominant wavelength" for fluorescent material and light emitting device spectra is the chromaticity diagram wavelength at the intersection of the extension of a line from the chromaticity diagram white point (0.333, 0.333) through the chromaticity coordinates of the fluorescent material with the chromaticity diagram spectral locus of monochromatic light (horse-shoe shaped outline of the chromaticity diagram).

TABLE 1

| Fluorescent Material | Peak Wavelength (nm) | Dominant Wavelength (nm) | Chromaticity x | Y | Chemical Formula | Average Particle Diameter (μm) |
|---|---|---|---|---|---|---|
| SCASN-1 | 626 | 605 | 0.651 | 0.349 | $(Sr, Ca)AlSiN_3: Eu$ | 14.4 |
| SCASN-1 | 633 | 608 | 0.658 | 0.342 | $(Sr, Ca)AlSiN_3: Eu$ | 11.8 |
| SCASN-1 | 628 | 601 | 0.636 | 0.363 | $(Sr, Ca)AlSiN_3: Eu$ | 2.4 |
| YAG | 566 | 575 | 0.470 | 0.517 | $Y_3Al_5O_{12}: Ce$ | 3.4 |

Comparative Example 1

Light emitting devices 100 as shown in FIGS. 1A-1C were made as described below for the examples and comparative examples. A light emitting element 2 and semiconductor element 7 were positioned on a mounting substrate. Specifically, a 1.0 mm by 1.0 mm approximately square light emitting element 2 having a thickness of approximately 0.11 mm and a dominant wavelength of 450 nm was fabricated by forming a semiconductor stack on a sapphire substrate. The light emitting element 2 was disposed in line with the semiconductor element 7 and mounted via Au (gold) conducting material 6 in flip-chip fashion to make the sapphire substrate side of the light emitting element the light emitting surface. The semiconductor element 7 with pre-formed Au bumps was mounted in flip-chip fashion on patterned conducting runs.

Next, one side (primary surface) of the translucent member 32 was coated with a fluorescent material layer 31 by printing. Borosilicate glass in sheet-form was used as the translucent member 32. The translucent member was formed in a 1.15 mm by 1.15 mm approximately square planar shape, which was larger than the surface of the light emitting element by 0.15 mm on each side, and a thickness of the translucent member was approximately 0.10 mm. A translucent member 32 in sheet-form had the fluorescent material layer 31, which used SCASN-1 and SCASN-2 fluorescent material with silicone resin as binder, printed on one primary surface and cut to the appropriate size.

The concentration of fluorescent material (summation of both SCASN-1 and SCASN-2) in the fluorescent material layer 31 was 186 mass %, and the planar shape of the fluorescent material layer facing the upper surface of the light emitting element was the same as that of the translucent member (a 1.15 mm by 1.15 mm approximately square shape), and a thickness of the fluorescent material layer was 80 μm. Because the translucent member 32 had a thickness of approximately 100 μm, a combined thickness of the translucent member 32 and fluorescent material layer 31 was approximately 180 μm.

Next, silicone resin was disposed as adhesive on the upper surface of the light emitting element 2, and the fluorescent material layer 31 formed on the surface of the translucent member 32 was joined to the sapphire substrate upper surface of the light emitting element 2. The surface area of the fluorescent material layer 31 was larger than that of the upper surface of the light emitting element 2, and the fluorescent material layer was joined in a manner establishing exposed regions around the light emitting element.

Next, regions around the light emitting element 2, fluorescent material layer 31, translucent member 32, and semiconductor element 7 were filled with a covering member 50. A covering member 50 was disposed along the lateral surfaces of the light emitting element 2, fluorescent material layer 31, and translucent member 32, and a covering member 50 was applied to completely embed the semiconductor element 7. In comparative example 1, dimethyl silicone resin was used as resin 51 in the covering member 50, and titanium oxide particles with an average particle diameter of 0.28 μm (measured in the same manner as fluorescent material average particle diameter) were used as light reflecting material 52. Titanium oxide particles were included in the resin with a concentration of 60 mass %. In comparative example 1, no fluorescent material was added to the covering member 50. A covering member thickness was 225 μm in comparative example 1. The covering member thickness is the thickness measured perpendicular to the lateral surface of the light emitting element from the lateral surface to the outer surface of the light emitting device 100, and is the thinnest part of the covering member. The covering member thickness is the same on all sides of the light emitting element except the side adjacent to the semiconductor element. Light emitting devices 100, as shown in FIGS. 1A-1C, were made according to this processing sequence.

Comparative Example 2

Light emitting devices of comparative example 2 were made the same way as those of comparative example 1 except that a smaller 0.8 mm by 0.8 mm approximately square light emitting element 2 with a thickness of approximately 0.11 mm was used.

First and Second Examples

Light emitting devices of the first and second examples were made the same way as those of comparative example 1 except that SCASN-3 second fluorescent material 53 was included (with different amounts for each example) in the covering member 50.

Comparative Example 3

Light emitting devices of comparative example 3 were made the same way as those of comparative example 1 except that YAG second fluorescent material 53 was included in the covering member 50.

Comparative Example 4

Light emitting devices of comparative example 4 were made the same way as those of comparative example 1 except that the amount of titanium oxide light reflecting material 52 added to the covering member 50 was reduced to 30 mass % (with respect to the resin 51).

Third and Fourth Examples

Light emitting devices of the third and fourth examples were made the same way as those of comparative example 4 except that SCASN-3 second fluorescent material 53 was included (with different amounts for each example) in the covering member 50.

Table 2 and Table 4 show, for comparative examples 1-4 and first through fourth examples, light emitting element size, first fluorescent material used in the wavelength conversion member, amount of titanium oxide light reflecting material added to the covering member, second fluorescent material type and amount added to the covering member, and thickness of the thinnest part of the covering member measured from the lateral surface of the light emitting element chip to the outside of the light emitting device.

The following parameters were evaluated for comparative examples 1-4 and the first through fourth examples.

Chromaticity and Dominant Wavelength

An optical measurement system combining a multi-channel spectrometer and integrating-sphere photometer was used to measure chromaticity and dominant wavelength for each comparative example and example. Evaluation results are shown in Table 3 and Table 5. In addition, chromaticity of comparative example 1 is shown on the chromaticity diagram in FIG. 2.

Dominant Wavelength Difference

The difference between the dominant wavelength of the light emitting device emission spectrum (i.e. the dominant wavelength of the spectrum of a light emitting device with no second fluorescent material included in the covering member) and the dominant wavelength of the emission spectrum of the second fluorescent material included in the covering member was computed as dominant wavelength difference in nanometers. Results are shown in Table 3 and Table 5.

Luminous Flux Ratio

A total luminous flux measurement device incorporating an integrating-sphere photometer was used to measure total luminous flux for the light emitting device of each comparative example and example. Luminous flux of comparative example 1 was assumed to be 100% and luminous flux for other comparative examples and examples were computed as a ratio with respect to comparative example 1. Luminous flux ratio results are also shown in Table 3 and Table 5.

Directional Chromaticity

Figure 5:
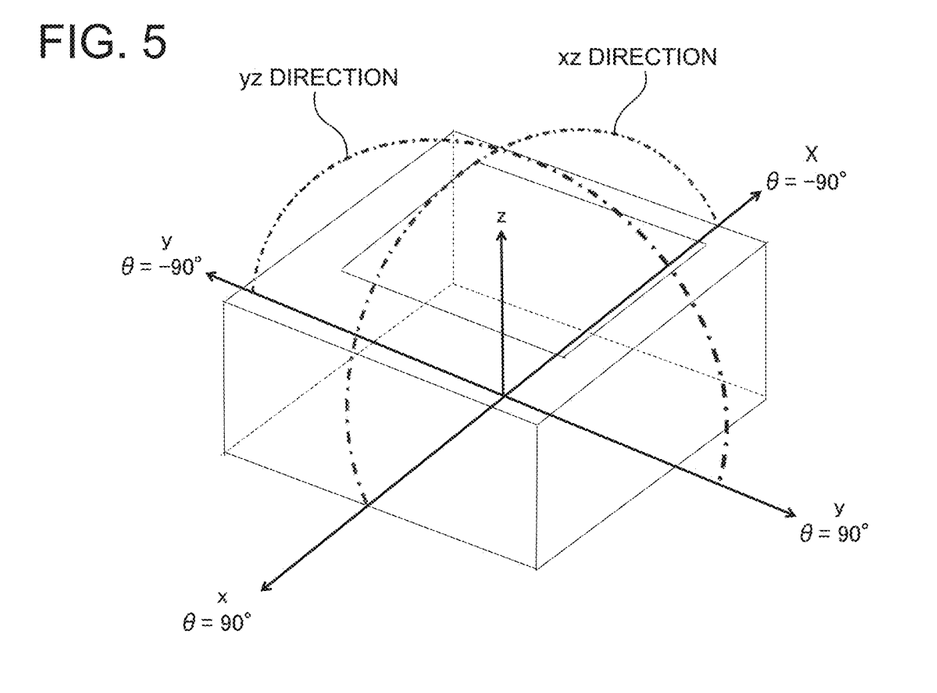
FIG. 5 is a schematic diagram showing the directions for measuring directional (orientation dependent) chromaticity.
Figure 6A:
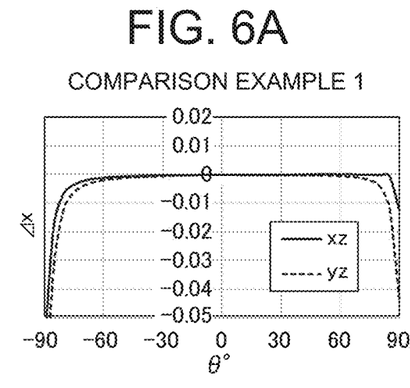
FIGS. 6A and 6B are diagrams showing directional chromaticity of a light emitting device of comparative example 1.
Figure 6B:
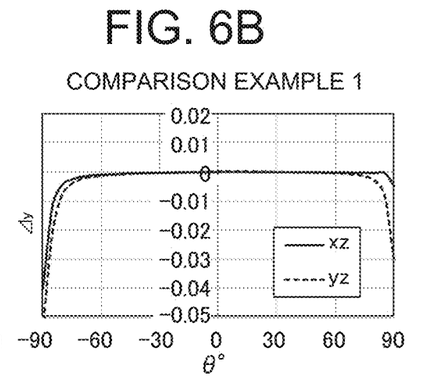
Figure 7A:
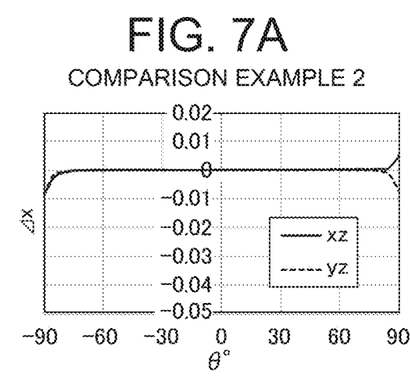
FIGS. 7A and 7B are diagrams showing directional chromaticity of a light emitting device of comparative example 2.
Figure 7B:
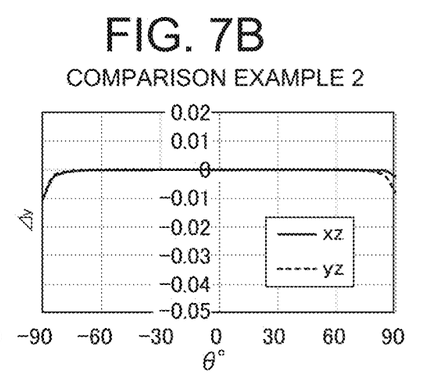
Figure 8A:
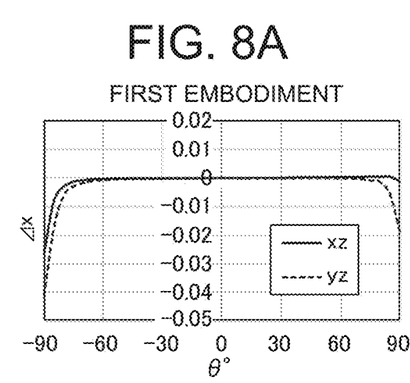
FIGS. 8A and 8B are diagrams showing directional chromaticity of a light emitting device of the first embodiment.
Figure 8B:
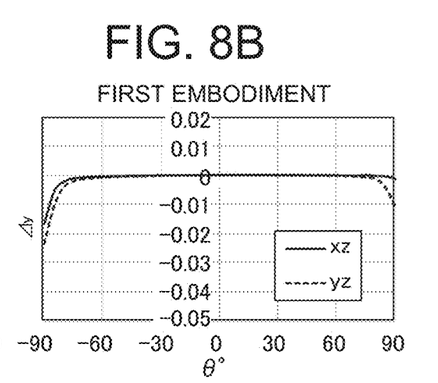
Figure 9A:
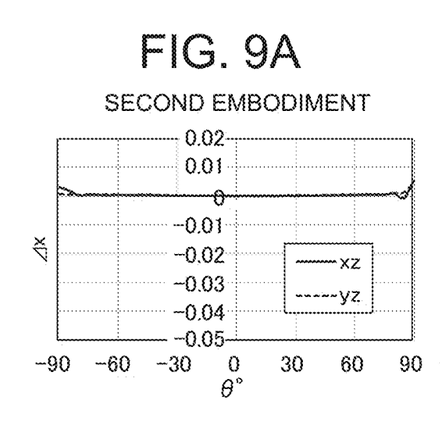
FIGS. 9A and 9B are diagrams showing directional chromaticity of a light emitting device of the second embodiment.
Figure 9B:
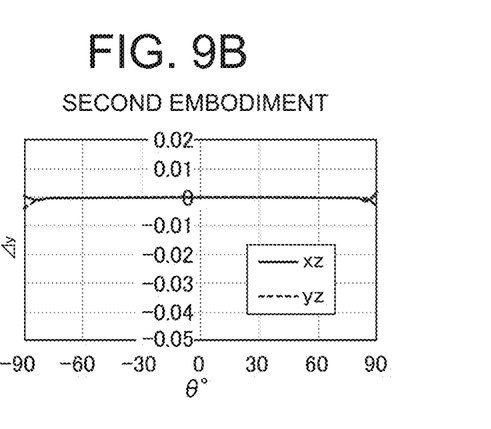
Figure 10A:
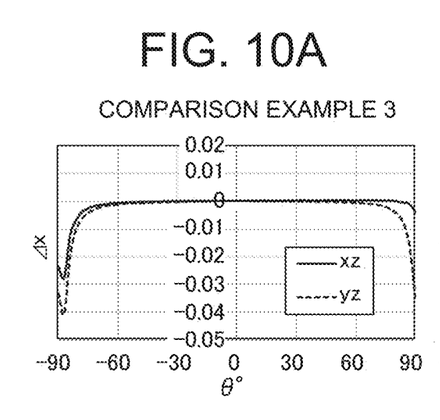
FIGS. 10A and 10B are diagrams showing directional chromaticity of a light emitting device of comparative example 3.
Figure 10B:
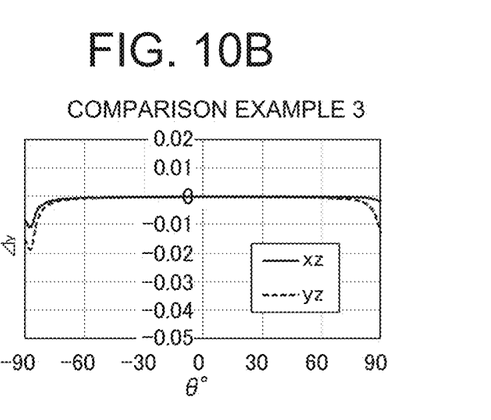
Figure 11A:
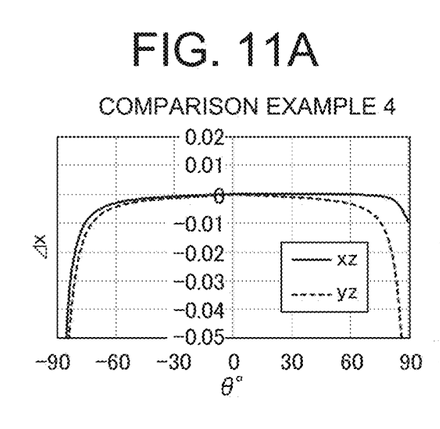
FIGS. 11A and 11B are diagrams showing directional chromaticity of a light emitting device of comparative example 4.
Figure 11B:
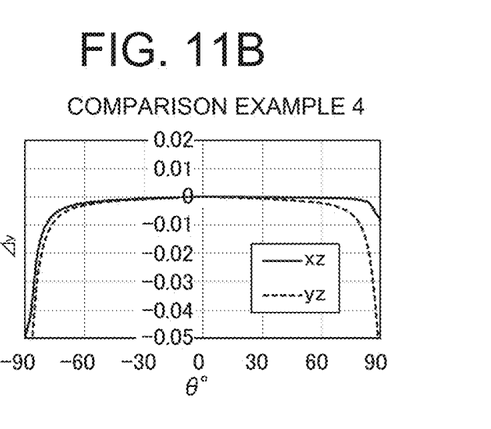
Figure 12A:
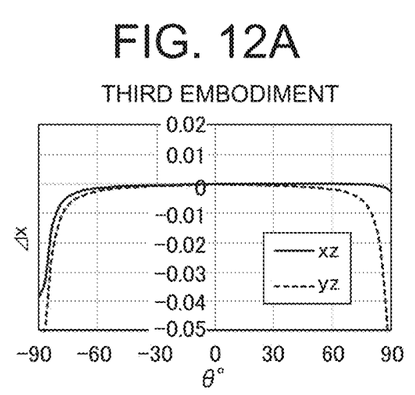
FIGS. 12A and 12B are diagrams showing directional chromaticity of a light emitting device of the third embodiment.
Figure 12B:
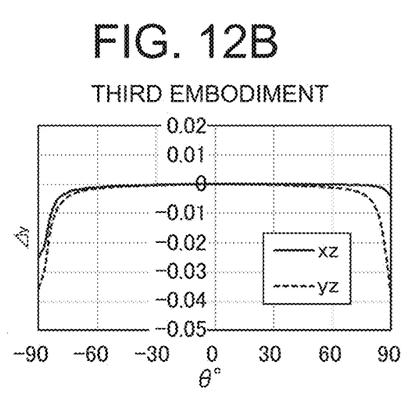
Figure 13A:
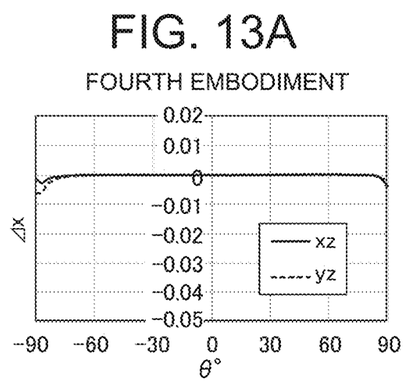
FIGS. 13A and 13B are diagrams showing directional chromaticity of a light emitting device of the fourth embodiment.
Figure 13B:
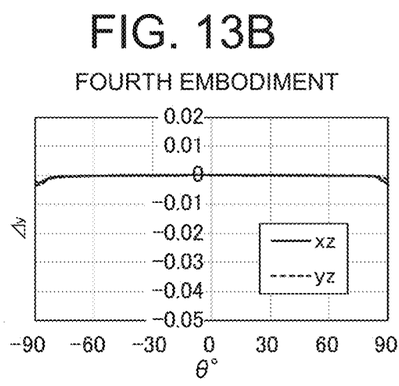

The relation of measurement direction to chromaticity (angular dependent chromaticity) was investigated for each light emitting device. For directional chromaticity (measurement direction-dependent chromaticity) measurement, the light emitting device for each comparative example and example was illuminated by passing 350 mA of current, while changing the measurement direction by rotating the light emitting device with a goniometer, emission chromaticity was measured using a spectral distribution measurement device (spectral distribution spectrometer) under CIE condition B recommended for "average LED luminance" measurement. The direction of measurement was set by an angle θ measured from the light emitting device optical axis C (that passes through the center-point of the light emitting device upper surface parallel to the z-axis). Measurement direction for directional chromaticity (direction-dependent chromaticity) is illustrated by the schematic diagram in FIG. 5. As shown in this figure, directional chromaticity was measured by varying the measurement angle θ in the x-z plane (xz-plane measurement) and in the y-z plane (yz-plane measurement). To evaluate the emitted color, x-coordinate and y-coordinate values in the CIE standard color system (chromaticity diagram color space) were used (note: color coordinates x and y are not related to the x and y axes in FIG. 5). Light emitting device directional chromaticity was evaluated using the θ=0° point as a reference, and color coordinate differences (Δx, Δy) were computed with respect to the reference at each measurement point.

Directional chromaticity measurement results for each sample are shown in FIGS. 6A-13B. Because the semiconductor element was located in the xz-plane between θ=0° and θ=90°, a covering member thickness was different in that region. Because the covering member thickness was the same in the other three quadrants, directional chromaticity graphs were considered only for xz-plane measurements from θ=0° to θ=−90°. Further, because observation angles from θ=−80° to θ=−90° are essentially side-views of the light emitting device (in the x-axis or y-axis directions of FIG. 5) and rarely viewed in practical applications, chromaticity evaluation was limited to the range from θ=0° to θ=−80°. Because large color differences occur at θ=−80°, directional chromaticity results reported in Table 3 and Table 5 are color coordinate differences Δx, Δy for the color emitted at θ=−80°, with respect to the color emitted at θ=0°.

TABLE 2

| | Light Emitting Device Size (mm × mm) | A wavelength conversion member First Fluorescent Material | A covering member | | | A covering member Thickness (μm) |
|---|---|---|---|---|---|---|
| | | | Titanium Oxide Content (mass %) | Second Fluorescent Material | Second Fluorescent Material Content (mass %) | |
| Comparative Example 1 | 1.0 × 1.0 | SCASN-1, SCASN-2 | 60 | — | — | 225 |
| Comparative Example 2 | 0.8 × 0.8 | SCASN-1, SCASN-2 | 60 | — | — | 300 |
| First Example | 1.0 × 1.0 | SCASN-1, SCASN-2 | 60 | SCASN-3 | 0.5 | 225 |
| Second Example | 1.0 × 1.0 | SCASN-1, SCASN-2 | 60 | SCASN-3 | 5.0 | 225 |
| Comparative Example 3 | 1.0 × 1.0 | SCASN-1, SCASN-2 | 60 | YAG | 0.5 | 225 |

TABLE 3

| | Chromaticity Coordinates | | Dominant Wavelength (nm) | Dominant Wavelength Difference (nm) | Luminous Flux Ratio (%) | Directional Chromaticity (xz-plane) | |
|---|---|---|---|---|---|---|---|
| | x | y | | | | Δx(−80°) | Δy(−80°) |
| Comparative Example 1 | 0.654 | 0.338 | 609 | — | 100.0 | −0.006 | −0.004 |
| Comparative Example 2 | 0.656 | 0.338 | 609 | — | 95.0 | −0.001 | −0.001 |
| First Example | 0.655 | 0.338 | 609 | 8 | 100.2 | −0.003 | −0.002 |
| Second Example | 0.656 | 0.338 | 609 | 8 | 100.0 | 0.000 | −0.001 |
| Comparative Example 3 | 0.656 | 0.338 | 609 | 34 | 100.7 | −0.007 | −0.003 |

From Table 2 and Table 3, the light emitting device of comparative example 1 had color coordinate differences at θ=−80° (directional chromaticity) of Δx=−0.006, Δy=−0.004 compared to the chromaticity at θ=0°. This means that the color emitted at θ=−80° was shifted towards blue, which is the color emitted by the light emitting element. Further, actual visual observation of the illuminated light emitting device confirmed a pink hue at θ=−80° different from the color emitted at θ=0°.

Because the light emitting element in comparative example 2 was smaller than the light emitting element in comparative example 1, directional chromaticity was better than that of comparative example 1. Actual visual observation of the illuminated light emitting device could not confirm any color difference at θ=−80°. Accordingly, if color coordinate differences Δx, Δy are within a range from −0.001 to +0.001, color non-uniformity is essentially unobservable. However, because the light emitting device of comparative example 2 had a smaller light emitting element, the luminous flux ratio was reduced. Consequently, directional chromaticity improvement without light emitting element size reduction was not achieved.

By adding fluorescent material to the covering member of the light emitting devices for the first and second examples, directional chromaticity improvement was verified. SCASN-3 fluorescent material, which has a dominant wavelength 8 nm shorter than the dominant wavelength of the light emitting device, was used in the covering member of the light emitting devices for the first and second examples, In particular, the second example, which incorporated 5.0 mass % of fluorescent material in the covering member, had both directional chromaticity coordinate differences Δx, Δy within the range from −0.001 to +0.001 implying little color non-uniformity. Furthermore, the luminous flux ratio was effectively equivalent to that of comparative example 1.

Comparative example 3, which used YAG fluorescent material with a dominant wavelength 34 nm shorter than the dominant wavelength of the light emitting device, had a fluorescent material content of 0.5% in the covering member, and results indicated that this approach could not easily improve directional chromaticity differences.

The dominant wavelength of fluorescent material added to the covering member of the examples was less than or equal to 30 nm different from the dominant wavelength of the light emitting device. Comparing the second example, which had a fluorescent material content of 5.0 mass %, with the first example, which had a fluorescent material content of 0.5 mass %, the absolute value of directional chromaticity coordinate differences Δx, Δy were smaller for the second example. Accordingly, fluorescent material content in the covering member is preferably greater than 0.5 mass % with respect to the resin.

TABLE 4

| | Light Emitting Device Size (mm × mm) | A wavelength conversion member First Fluorescent Material | A covering member | | | |
|---|---|---|---|---|---|---|
| | | | Titanium Oxide Content (mass %) | Second Fluorescent Material | Second Fluorescent Material Content (mass %) | A covering member Thickness (μm) |
| Comparative Example 4 | 1.0 × 1.0 | SCASN-1, SCASN-2 | 30 | — | — | 225 |
| Third Example | 1.0 × 1.0 | SCASN-1, SCASN-2 | 30 | SCASN-3 | 0.5 | 225 |
| Fourth Example | 1.0 × 1.0 | SCASN-1, SCASN-2 | 30 | SCASN-3 | 5.0 | 225 |

TABLE 5

| | Chromaticity Coordinates | | Dominant Wavelength | Dominant Wavelength | Luminous Flux Ratio | Directional Chromaticity (xz-plane) | |
|---|---|---|---|---|---|---|---|
| | x | y | (nm) | Difference (nm) | (%) | Δx(−80°) | Δy(−80°) |
| Comparative Example 4 | 0.654 | 0.336 | 609 | — | 98.3 | −0.020 | −0.013 |
| Third Example | 0.656 | 0.337 | 609 | 8 | 99.1 | −0.009 | −0.006 |
| Fourth Example | 0.658 | 0.338 | 609 | 8 | 99.0 | 0.001 | −0.001 |

As shown in Table 4 and Table 5, comparative example 4, which included a lower content of titanium oxide in the covering member compared to comparative example 1, had degraded directional chromaticity. Specifically, comparative example 4 had directional chromaticity coordinate differences of Δx=−0.020, Δy=−0.013 at θ=−80°. Compared to the chromaticity at θ=0°, this represents a significant shift in the color emitted at θ=−80° towards the blue light emitted by the light emitting element. Because the content of titanium oxide reflecting material was reduced, the amount of light, particularly light emitting element light, not reflected by titanium oxide and passing through the covering member to the outside of the light emitting device was believed to have increased.

By addition of fluorescent material to the covering member of light emitting devices for the third and fourth examples, directional chromaticity improvement was observed. In particular, the fourth example that included 5.0 mass % of fluorescent material the same as the second example, which included 60 mass % titanium oxide, had both directional chromaticity coordinate differences Δx, Δy within the −0.001 to +0.001 range indicating practically no color non-uniformity.

The light emitting device of the present disclosure can be used in applications such as automotive applications, indicator and display devices, illumination and lighting equipment, monitors and displays, and liquid crystal display backlight.

It should be apparent to those of ordinary skill in the art that, while various examples of the invention have been shown and described, it is contemplated that the invention is not limited to the particular examples disclosed. Rather, the disclosed example should be considered to be merely illustrative of the inventive concepts and should not be interpreted as limiting the scope of the invention. The disclosed examples may be modified and changed so long as they remain within the spirit and scope of the invention as defined in the appended claims.

What is claimed is:

1. A light emitting device comprising:
a light emitting element having a dominant wavelength in a range greater than or equal to 380 nm and less than or equal to 470 nm;
a wavelength conversion member that is disposed on the light emitting element and comprises a first fluorescent material; and
a covering member that covers the sides of the wavelength conversion member and surrounds the light emitting element,
wherein the light emitting device has an emission spectrum having a dominant wavelength in a range greater than or equal to 610 nm and less than or equal to 780 nm,
wherein the covering member comprises light reflecting material and a second fluorescent material,
wherein a dominant wavelength of an emission spectrum of the second fluorescent material differs from the dominant wavelength of the emission spectrum of the light emitting device by less than or equal to 30 nm, and
wherein a chromaticity of light emitted by the light emitting device is within a four-sided region on a CIE 1931 chromaticity diagram, where chromaticity coordinates (x, y) are (0.645, 0.335) at a first point, (0.665, 0.335) at a second point, (0.735, 0.265) at a third point, (0.721, 0.259) at a fourth point, and a first line joins the first and second points, a second line joins the second and third points, a third line joins the third and fourth points, and a fourth line joins the fourth and first points to define the four-sided region of the chromaticity diagram.

2. The light emitting device as cited in claim 1 wherein the second fluorescent material of the covering member comprises at least one compound selected from (Ca, Sr)AlSiN$_3$:Eu and (Ca, Sr, Ba)$_2$Si$_5$N$_8$:Eu.

3. The light emitting device as cited in claim 1 wherein the first fluorescent material of the wavelength conversion member comprises at least one compound selected from (Y, Gd, Tb, Lu)$_3$(Al, Ga)$_5$O$_{12}$:Ce, (Ca, Sr)AlSiN$_3$:Eu, and (Ca, Sr, Ba)$_2$Si$_5$N$_8$:Eu.

4. The light emitting device as cited in claim 1 wherein an average particle diameter of the second fluorescent material of the covering member is less than or equal to 10 μm.

5. The light emitting device as cited in claim 1 wherein an amount of the second fluorescent material of the covering member is greater than or equal to 0.5 mass % and less than or equal to 10 mass % with respect to resin in the covering member.

6. The light emitting device as cited in claim 1 wherein an amount of the light reflecting material of the covering member is greater than or equal to 10 mass % and less than or equal to 100 mass % with respect to resin in the covering member.

7. The light emitting device as cited in claim 1 wherein a minimum thickness of the covering member measured perpendicular to a lateral surface of the light emitting element is less than or equal to 300 μm.

8. The light emitting device as cited in claim 1 wherein the light reflecting material of the covering member comprises at least one compound selected from titanium dioxide, silicon dioxide, zirconium dioxide, and alumina.

9. The light emitting device as cited in claim 1 wherein a change in chromaticity coordinates with angular direction from a direction perpendicular to a light emitting surface of the wavelength conversion member to a direction rotated by 80° is less than or equal to 0.003 in both x-axis and y-axis directions, where the x-axis and y-axis are mutually perpendicular and lie in the plane of the wavelength conversion member light emitting surface.

10. A light emitting device comprising:
a light emitting element having a dominant wavelength in a range greater than or equal to 380 nm and less than or equal to 470 nm;
a wavelength conversion member that is disposed on the light emitting element and comprises a first fluorescent material; and
a covering member that covers sides of the wavelength conversion member and surrounds the light emitting element,
wherein the light emitting device has an emission spectrum having a dominant wavelength in a range greater than or equal to 610 nm and less than or equal to 780 nm,
wherein the covering member comprises light reflecting material and a second fluorescent material,
wherein a dominant wavelength of an emission spectrum of the second fluorescent material differs from the dominant wavelength of the emission spectrum of the light emitting device by less than or equal to 30 nm,
wherein the second fluorescent material of the covering member comprises at least one compound selected from $(Ca, Sr)AlSiN_3:Eu$ and $(Ca, Sr, Ba)_2Si_5N_8:Eu$, and
wherein the first fluorescent material of the wavelength conversion member comprises at least one compound selected from $(Ca, Sr)AlSiN_3:Eu$ and $(Ca, Sr, Ba)_2Si_5N_8:Eu$.

* * * * *